United States Patent
Yoon et al.

(10) Patent No.: US 8,058,683 B2
(45) Date of Patent: Nov. 15, 2011

(54) ACCESS DEVICE HAVING VERTICAL CHANNEL AND RELATED SEMICONDUCTOR DEVICE AND A METHOD OF FABRICATING THE ACCESS DEVICE

(75) Inventors: Jae-Man Yoon, Seoul (KR); Yong-Chul Oh, Suwon-si (KR); Hui-Jung Kim, Seoul (KR); Hyun-Woo Chung, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 211 days.

(21) Appl. No.: 11/954,135

(22) Filed: Dec. 11, 2007

(65) Prior Publication Data

US 2008/0173936 A1    Jul. 24, 2008

(30) Foreign Application Priority Data

Jan. 18, 2007    (KR) .................. 10-2007-0005477

(51) Int. Cl.
*H01L 27/088* (2006.01)
*H01L 29/78* (2006.01)
*H01L 21/336* (2006.01)

(52) U.S. Cl. . 257/329; 257/328; 257/330; 257/E27.096; 257/E21.41; 257/E29.131; 257/E29.262; 438/156; 438/206; 438/268

(58) Field of Classification Search .................. 438/197, 438/268, 269, 270, 274, 156, 206; 257/327–329, 257/335, 336, E27.001, E27.01, E27.046, 257/E27.059, E27.06, E27.061, E27.081, 257/E27.084–E27.086, E27.098, E27.099, 257/E27.102–E27.103, E27.096, E29.131, 257/E29.262, E21.41

See application file for complete search history.

(56) References Cited

U.S. PATENT DOCUMENTS

| | | | |
|---|---|---|---|
| 5,270,239 A | 12/1993 | Min et al. | |
| 5,376,575 A | 12/1994 | Kim et al. | |
| 5,497,017 A | 3/1996 | Gonzales | |
| 5,574,299 A | 11/1996 | Kim | |
| 5,578,850 A | 11/1996 | Fitch et al. | |
| 5,627,390 A * | 5/1997 | Maeda et al. | 257/302 |
| 5,828,094 A | 10/1998 | Lee | |
| 5,885,864 A | 3/1999 | Ma | |
| 6,172,391 B1 | 1/2001 | Goebel et al. | |
| 2006/0043450 A1 * | 3/2006 | Tang et al. | 257/302 |
| 2006/0046392 A1 * | 3/2006 | Manning et al. | 438/268 |
| 2006/0097304 A1 | 5/2006 | Yoon et al. | |
| 2006/0118846 A1 | 6/2006 | Bissey et al. | |
| 2006/0125044 A1 * | 6/2006 | Haller | 257/506 |
| 2006/0258087 A1 * | 11/2006 | Manning et al. | 438/242 |
| 2007/0190766 A1 * | 8/2007 | Seo et al. | 438/585 |

* cited by examiner

*Primary Examiner* — A. Sefer
*Assistant Examiner* — Ermias Woldegeorgis
(74) *Attorney, Agent, or Firm* — Volentine & Whitt, PLLC

(57) ABSTRACT

An access device and a semiconductor device are disclosed. The access device includes a vertically oriented channel separating a lower source/drain region and an upper source/drain region, a gate dielectric disposed on the channel, and a unified gate electrode/connection line coupled to the channel across the gate dielectric, wherein the unified gate electrode/connection line comprises a descending lip portion disposed proximate to the gate dielectric and overlaying at least a portion of the lower source/drain region.

17 Claims, 13 Drawing Sheets

ACCESS DEVICE HAVING VERTICAL CHANNEL AND RELATED SEMICONDUCTOR DEVICE AND A METHOD OF FABRICATING THE ACCESS DEVICE

CROSS REFERENCE TO RELATED APPLICATION

This application claims priority to Korean Patent Application No. 2007-005477 filed Jan. 18, 2007, the subject matter of which is hereby incorporated by reference.

BACKGROUND OF THE INVENTION

1. Field of the Invention

The invention relates generally to access devices, semiconductor devices incorporating an access device, and methods of fabricating same. More particularly, the invention relates to an access device having a vertically oriented channel and related semiconductor devices and methods of fabrication.

2. Description of Related Art

The operation of modern electronics is largely predicated upon the performance capabilities of the individual elements arranged to form semiconductor devices. The dynamic random access memory (DRAM) is an excellent contemporary and historical example of a semiconductor device. The DRAM is widely used in computer systems and other consumer electronics to store data. Their data storage capabilities have increased dramatically over the years as the elements implementing the DRAM have been substantially reduced in size without loss of functionality.

A DRAM may be understood as a vast array of memory cells arranged at the respective intersections of a matrix of row-wise word lines and columnar bit lines. Each memory cell typically includes an access element such a field effect transistor (FET) coupled to a storage element such as a capacitor. The access element allows the transfer of electrical charge from/to the storage element during read/write operations according to control voltages applied to a gate region of the access element.

The storage capacity per unit size of a DRAM is dictated to a large extent by the maximum possible integration density for the memory cells forming the memory cell array. In turn, the size of (i.e., the area occupied by) the constituent access elements and storage elements determines the maximum possible integration density. Accordingly, research and development efforts have been constantly expended in attempts to minimize the size of access elements and storage elements and improve integration density.

As a practical matter the integration density of a semiconductor device is limited by the collection technologies used to fabricate it. That is, the constellation of available technologies applied to the fabrication of a semiconductor device defines the physical scale of the individual elements forming the semiconductor device. This scale or feature size "F" may be used to designate minimum relative geometries for the elements, and largely determines the maximum integration density for the resulting semiconductor device. For example, Figure (FIG.) 1 is a graph illustrating a relationship between shrinking design rules, as indicated by the descending plot of squares, and various DRAM design families, as indicated by the plots of triangles (an 8F2 family), inverted triangles (a 6F2 family), and circles (a 4F2 family).

Existing and extrapolated die counts per fabrication wafer are shown for each design family over a period of time ranging from year 2002 through year 2010. Clearly, a move towards the 4F2 family of semiconductor devices will result in a greater number of die yielded per fabrication wafer. Such yield increase has important consequences to the profitability of semiconductor manufacturing operations.

However, in order to fabricate reliable semiconductor devices at a 4F2 scale, considerable additional attention must be directed to minimizing the size of constituent elements without loss of functionality. In this vein, the area occupied in a memory cell matrix by individual memory cells has been reduced by replacing laterally oriented access elements (i.e., access elements having a principal channel formed in the X/Y plane) with vertically oriented access elements (i.e., access elements having a principal channel formed in the Z plane orthogonal to the X/Y plane). Of course, the designation of X, Y, and Z orientations is an arbitrary one typically made in relation to the principal working surface of a substrate, but for clarity of description relative to the related drawings such designations are quite helpful. So, in the description that follows a convention will be adopted that assumes the X and Y directions are consistent with the orientation of word and bits lines running across a principal surface of a substrate, and that the Z direction is orthogonally "vertical" relative to this "lateral" X/Y plane.

With this convention in place, FIGS. 2A, 2B and 2C are considered. FIG. 2C is a perspective illustration showing a portion of a conventional DRAM memory cell matrix incorporating individual memory cells including a vertically oriented access element. Each access element has a vertically oriented channel extending in the Z direction from a buried bit line (BBL) region 2 formed on an isolation region 1 of a substrate to a storage node 5 formed above a word line 4. The vertical channel is implemented as a silicon pillar extending upward from the substrate. The transfer of electrical charge through the vertical channel is controlled by a gate 3. The term "pillar" in this context assumes a similar convention to that described above which assumes a horizontally disposed substrate populated by columnar or pillar shaped structures extending vertically (in the Z direction) from the substrate. The term pillar subsumes vertical structures having any reasonable aspect ratio.

As may be seen from reference to FIGS. 2A and 2B, individual memory cells including this type of vertically oriented channel may be more densely grouped together in a memory cell array in comparison with conventional memory cells incorporating access elements including a laterally oriented channel. That is, FIG. 2A is a top down illustration of a memory cell array defined by pillar mask patterns having a 2F by 2F cell matrix layout. FIG. 2B further illustrates this memory cell array by showing constituent word lines, bit lines, and an insulating oxide spacer.

Unfortunately, conventionally formed access devices including vertically oriented channels suffer from a number of performance and fabrication issues. A first class of these issues relates to the formation of a connection line (e.g., a word line in the context of a semiconductor memory device connecting a row of memory cells). Conventionally, connection lines such as word lines and gate electrodes associated with a connected access element are separately fabricated. This approach not only requires the application of two separate fabrication processes, but also suffers from problems associated with elevated connection line resistance caused by the presence of natural oxides or other contamination layers between the connection line and the gate electrode.

Another class of issues relates to the contact resistance between a subsequently formed connection (e.g., a storage element in the context of a semiconductor memory device) and an access element having a vertically oriented channel. Here again, contamination and/or abuse from fabrication processes may result in the formation of natural oxides, other contamination layers or material layer damage that results in elevated contact resistance between a subsequently element and an upper end of the vertically oriented access element (e.g., an upper source/drain region).

At least in the context of a RAM devices, vertically oriented access elements frequently result in high levels of gate induced drain leakage (GIDL). GIDL has adverse consequences to the refresh rate and power consumption of a memory device incorporating the access element.

Another class of fabrication related issues plaguing vertically oriented access elements in the context of semiconductor memory devices concerns the nature and geometric orientation or alignment of a buried bitline (BBL) structure. For reasons well understood in the art, a lightly doped (LD) structures are often preferred for the formation of lower source/drain regions associated with BBL structures. However, the formation of a LD lower source/drain region has proven to be a difficult task, requiring numerous fabrication steps and often resulting in alignment problems.

Taken as a collection, these continuing issues and others related to the design and fabrication of semiconductor devices incorporating access elements having a vertically oriented channel have greatly impeded manufacturers' practical ability to fabricate such devices at acceptable cost points and reliability expectations.

SUMMARY OF THE INVENTION

Embodiments of the invention address the issues impeding the reliable design and fabrication of semiconductor devices incorporating access elements having vertically oriented channels. Certain embodiments of the invention include a unified gate electrode/connection line that avoids the problems, such as elevated connection line resistance, inherent in the separate fabrication of a connection line to electrically contact previously formed gate electrode(s). Certain embodiments of the invention also provide a contact node formed by selective epitaxial growth. This type of contact node reduces the contact resistance between a subsequently formed element (e.g. a storage element) and a corresponding access element having a vertically oriented channel. Certain embodiments of the invention provide a buried bitline (BBL) structure comprising an offset step region. This type of BBL structure allows excellent self-alignment properties with respect to a corresponding vertically oriented channel.

Embodiments of the invention find application in many different types of semiconductor devices, including memory devices (e.g., DRAM, SRAM, flash, etc.) and control logic devices. Any access device (e.g. transistor) previously integrated within contemporary semiconductor devices using a lateral channel orientation may be susceptible to implementation using a vertically oriented channel consistent with an embodiment of the invention.

In one embodiment, the invention provides an access device adapted for use in a semiconductor device and comprising; a vertically oriented channel separating a lower source/drain region and an upper source/drain region, a gate dielectric disposed on the channel, a unified gate electrode/connection line coupled to the channel across the gate dielectric, wherein the unified gate electrode/connection line comprises a descending lip portion disposed proximate to the gate dielectric and overlaying at least a portion of the lower source/drain region.

Where such a semiconductor device is a memory device, the unified gate electrode/connection line may serve as a unified gate electrode/word line and the lower source/drain region may be associated with a buried bit line (BBL) structure. In certain related embodiments, the BBL structure may comprise an offset step region.

In another embodiment, the invention provides a semiconductor device, comprising; adjacent first and second access devices disposed on a substrate, each first and second access device comprising a vertically oriented channel separating a lower source/drain region and an upper source/drain region, and a gate dielectric disposed on the channel, a first interlayer insulating layer disposed on the substrate and separating the first and second access devices, and a unified gate electrode/connection line disposed on the first interlayer insulating layer and coupled to the channel of the first and second access devices, wherein the unified gate electrode/connection line comprises descending lip portions, each descending lip portion being disposed proximate to the gate dielectric of the first access device or the second access device and overlaying at least a portion of a lower source/drain region associated with the first access device or the second access device.

In another embodiment, the invention provides a memory system comprising; a memory controller connected to and controlling operation of a memory, the memory comprising a memory cell region, the memory cell region comprising an array of memory cells, each memory cell in the array comprising an access element and a storage element, wherein each access element comprises; a vertically oriented channel separating a lower source/drain region and an upper source/drain region, a gate dielectric disposed on the channel, a unified gate electrode/word line coupled to the channel across the gate dielectric, wherein the unified gate electrode/word line comprises a descending lip portion disposed proximate to the gate dielectric and overlaying at least a portion of the lower source/drain region.

In certain related embodiments, the memory may further comprise a peripheral region comprising; a first type access device comprising a laterally oriented channel separating first and second source/drain regions, and a second type access device comprising a vertically oriented channel separating lower and upper source/drain regions, a gate dielectric disposed on the channel, and a unified gate electrode/word line coupled to the channel across the gate dielectric, wherein the unified gate electrode/word line comprises a descending lip portion disposed proximate to the gate dielectric and overlaying at least a portion of the lower source/drain region.

The peripheral region may comprise a decoder circuit applying control voltages to the unified gate electrode/word line response to a command communicated from the memory system controller.

BRIEF DESCRIPTION OF THE DRAWINGS

Embodiments of the invention are described in relation to the accompanying drawings. Throughout the drawings and written description like reference numbers indicate like exemplary elements, components, and steps. In the drawings.

DESCRIPTION OF EMBODIMENTS

Figure 1:
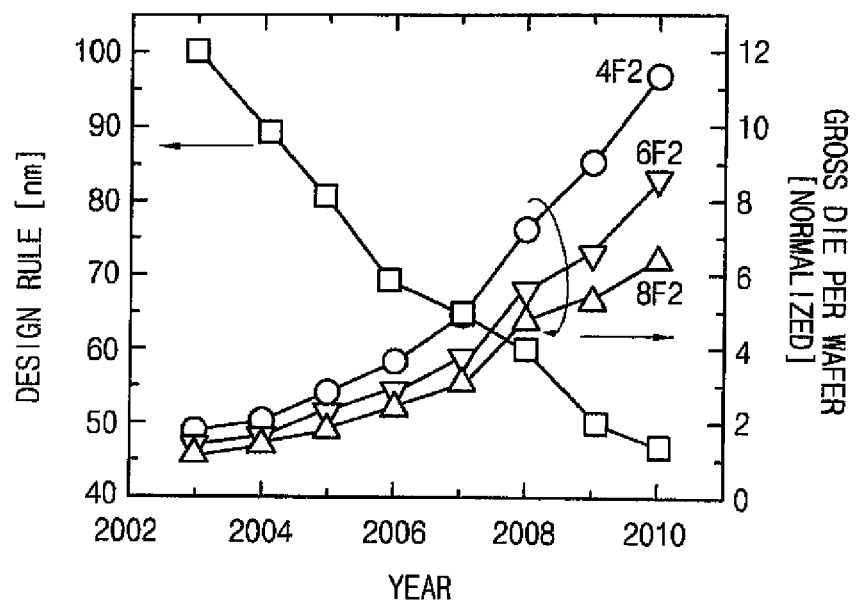
FIG. 1 is a graph illustrating an exemplary relationship between reduced design rules over time and a resulting number of die per fabrication wafer.
Figure 2A:
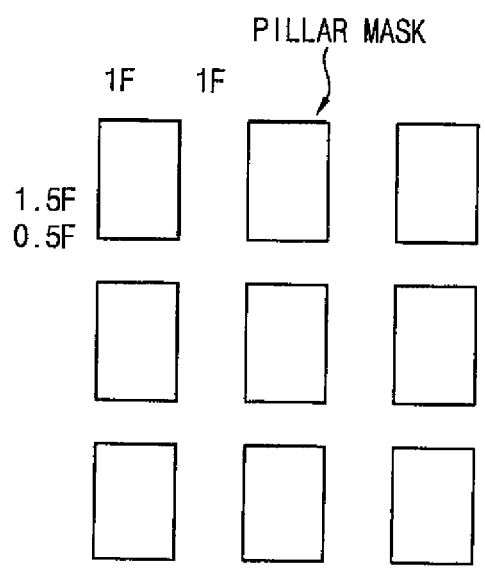
FIGS. 2A, 2B and 2C are related illustrations showing layout and perspective views of a memory cell array incorporating conventional access devices having vertical channels.
Figure 2B:
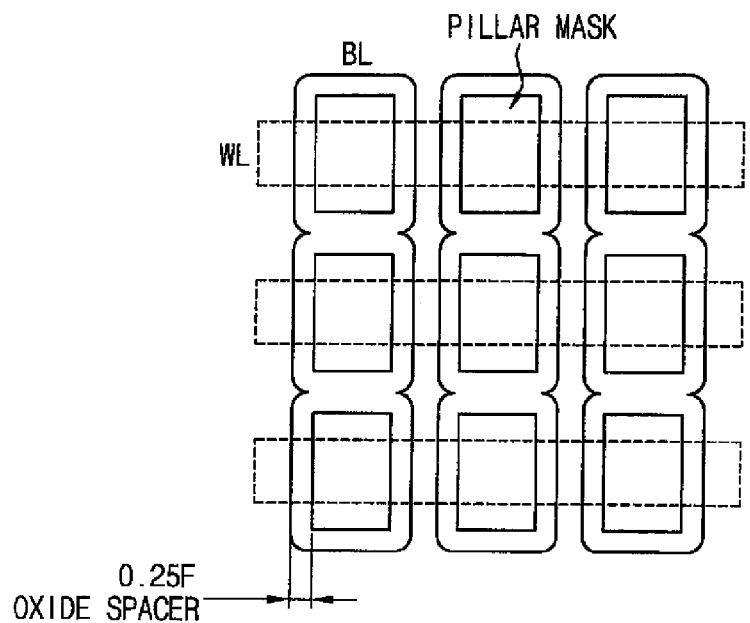
Figure 2C:
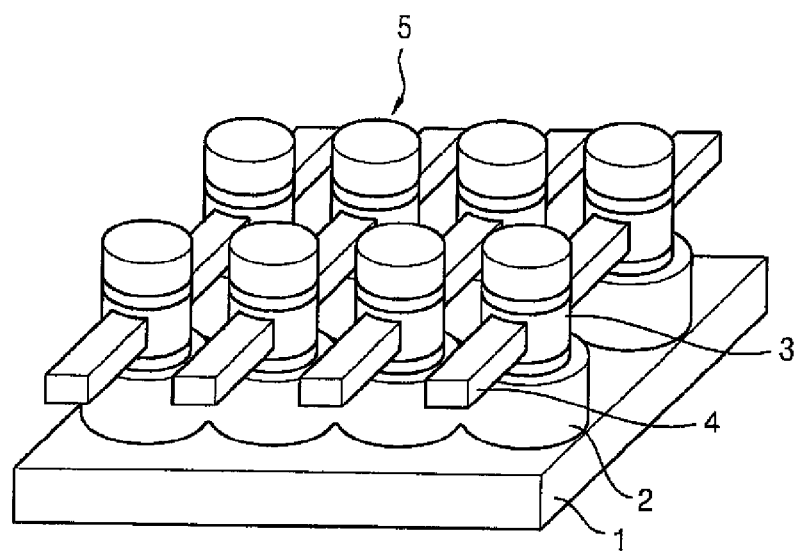

Embodiments of the invention will now be described with reference to the accompanying drawings. The invention may, however, be alternately and variously embodied and is not limited to only the illustrated embodiments. Rather, the illustrated embodiments are presented as teaching examples. The actual scope of the invention is defined by the claims that follow.

Embodiments of the invention are characterized by a vertically oriented channel. As noted above, use of the term "vertical" is a geometrically arbitrary one intended to merely distinguish conventional active devices having a "lateral" channel orientation. This term should not be given an overly literal or wooden interpretation. For example, the term clearly subsumes channel structures extending 90° from a principal working surface of a substrate. However, an exactly orthogonal disposition is not necessary to fall within the scope of the term "vertically oriented". Indeed, other channel orientations relative to a principal substrate surface, e.g., those extending at an angle of between 90° to 45°, may properly be viewed as having a "vertical" component to their disposition, and are therefore properly considered a vertically oriented channel.

While amendable to incorporation within a wide range of semiconductor devices, embodiments of the invention find particular application within memory devices such as DRAMs where dense memory cell integration requires a compact channel design. This being the case, and without loss of generality, several embodiments of the invention will be described in relation to DRAM examples. Embodiments of the invention may however be applied to generic logic circuits, as well as other types if memory devices such as SRAM, NAND and NOR flash, etc.

In the description that follows, the term "access element" is used to broadly denote any active element adapted for use in a semiconductor doctor device and generally comprising a channel separating source/drain regions. In a lateral access device first and second source/drain regions are laterally separated by a channel, as compared with a vertical access device where upper and lower sources drain regions are separated by a channel. An active element allows the controlled flow or transfer of electrical carriers (electrons and/or holes) from one source/drain region to another source/drain region, or from one source drain/region to another component associated with the access element (e.g., a floating gate in a flash memory).

The design and fabrication of conventional access elements having a vertically oriented channel have been marked by accommodation and trade-offs. For example, the fabrication of a lower source/drain region within a conventional vertical access device generally includes; (1) the formation of a gate electrode, followed by (2) a first doping process, (3) an etch back process, and (4) a second doping process to form the source/drain region. After formation of the lower source/drain region, a connection line is formed in contact with the gate electrode. This approach readily facilitates the formation of a lower source/drain region (and a lightly doped lower source/drain region), but it then struggles with the separate formation of a corresponding connection line. One aspect of this struggle in the absence of a gate dielectric capable of insulating the later-formed connection line from the lower source/drain region. Obviously, electrical contact between the lower source/drain region and connection line impairs the operating properties of the access element. Thus, the intervening presence and insulating effect of a gate dielectric layer would be very helpful in avoiding this potential problem. However, the conventional fabrication approach completely covers the gate dielectric with a gate electrode. So it is not available to insulate the connection line from the lower source/drain region.

In contrast, embodiments of the invention first form a lower source/drain region, which may be lightly doped in its implementation, and thereafter provide a unified gate electrode/word line. The term "unified" in this context means a single conductive structure serving as both a gate electrode surrounding (or partially surrounding) a vertically oriented channel and a corresponding connection line. The connection line may serve any number of purposes, but will generally be used to apply one or more control voltages to the channel. In the context of a semiconductor memory device, the unified gate electrode/connection line may function as a word line applying conventional word line voltages to a row of memory cells, each comprising a vertically oriented channel.

As fabricated in embodiments of the invention, the unified gate electrode/connection line will not suffer from problems like elevated contact resistance between the gate electrode and connection line portions, since the two portions are simultaneously formed without the presence of a discontinuous material boundary. Thus, no natural oxide layer(s) or other contamination can form between the gate electrode and connection line.

Further, the unified gate electrode/connection line may be formed using a single fabrication process. Distinct fabrication processes forming a gate electrode and connection line are not required, thereby simplifying the overall fabrication process for the constituent semiconductor device.

A fabrication approach consistent with an embodiment of the invention yields a semiconductor element having a vertically oriented channel insulated by a gate dielectric. However, the gate dielectric may also disposed in such a manner so as to insulate a lower source/drain region or a portion of a lower source/drain region from an overlaying unified gate electrode/connection line. In one embodiment, as will be further described, the gate dielectric may be formed with a lower later portion extending away from the channel and separating a descending lip portion of the unified gate electrode connection line.

Embodiments of the invention provide a lower source/drain region "self aligned" in its formation with a corresponding vertically oriented channel. The lower source/drain region may have a lightly-doped structure and yet maintain excellent alignment without the requirement of extraneous masking or etchback steps. Further, the formation of a self-aligned lower source/drain region in embodiments of the invention does not require the separate formation of a connection line in relation to a gate electrode.

Figure 3A:
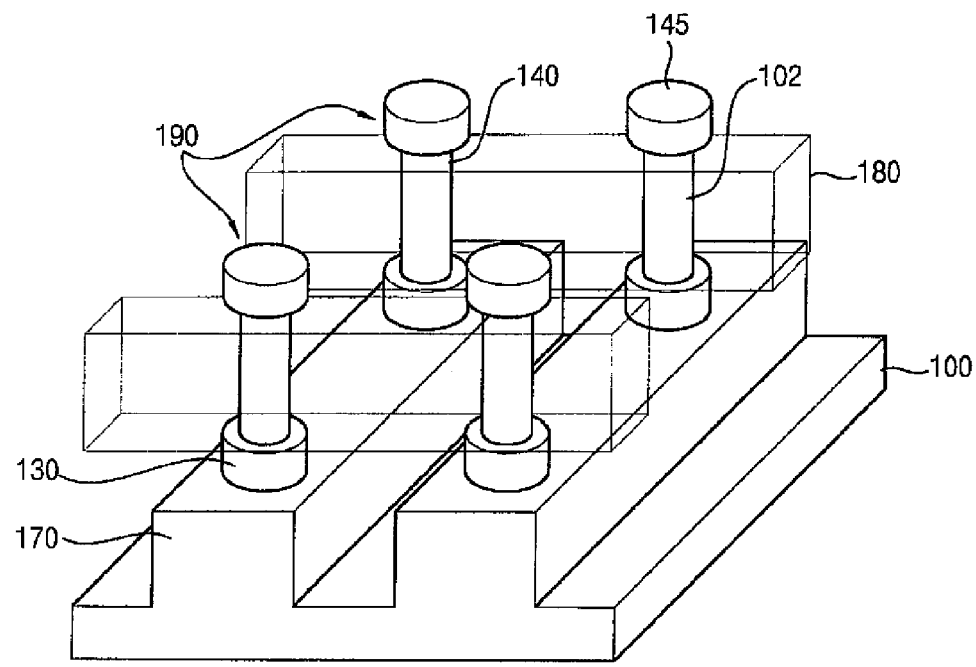
FIG. 3A is a perspective view of a memory cell array portion incorporating access devices having vertical channels and fabricated according to an embodiment of the invention.

For example, one embodiment of the invention is illustrated in the perspective view of FIG. 3A. Here, a portion of a memory cell array such as the type commonly found in a DRAM includes a plurality of word lines 180 extending in an X direction, a plurality of buried bit lines 170 extending in a Y direction, and a plurality of access elements 190 arranged at the respective intersections of word lines 180 and bit lines 170. Each access element comprises a lower source/drain region 130 and an upper source/drain region 140 separated by a channel region implemented as a vertical pillar 102 (e.g., a vertically oriented channel). The upper source/drain region 140 is connected in the illustrated example to a contact pad 145 formed by a selective epitaxial growth process. However, this type of contact pad is optional to the embodiment.

Figure 3B:
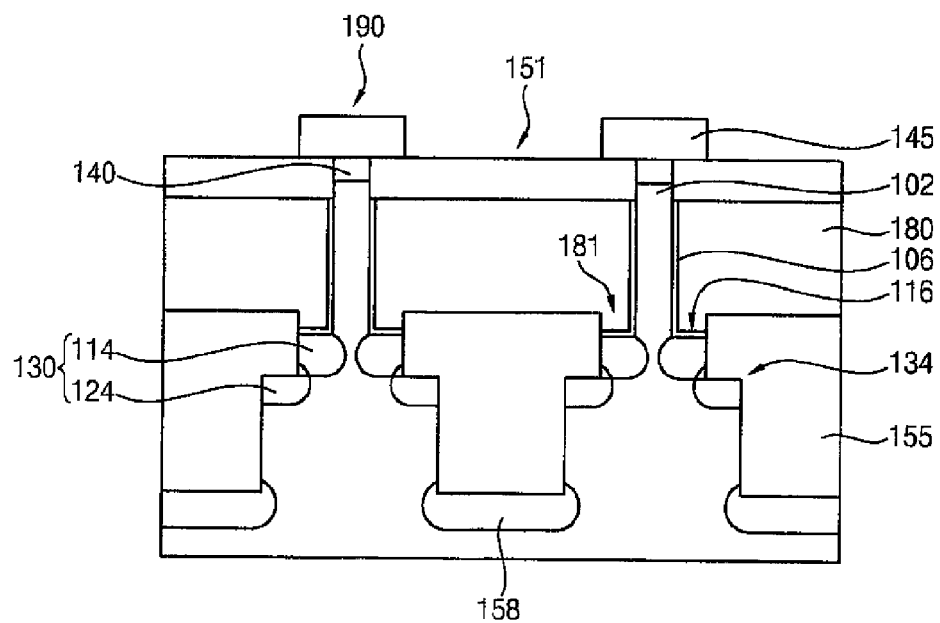
FIG. 3B is a cross-sectional view further illustrating the embodiment of FIG. 3A.

The embodiment of FIG. 3A is further illustrated in the cross-sectional view of FIG. 3B. Here, the plurality of word lines 180 can be better seen in their respective implementations as unified gate electrode/word line structures. Each unified gate electrode/word line 180 is insulated from a corresponding plurality of vertical pillars 102, each forming a vertically oriented channel region for respective access elements 190, by a gate dielectric 106. Gate dielectric 106 also insulates a descending lip portion 181 of unified gate electrode/word line 180 overlaying at least a portion of lower source drain region 130.

Adjacent access elements 190, and particularly buried bitline (BBL) portions of adjacent access elements 190, are separated by a first interlayer insulating layer 155 at least partially formed in an isolation recess 151. Isolation recess 151 is formed in substrate 100 between adjacent access elements 190. A doped isolation region 158 may be optionally provided in substrate 100 under and/or proximate isolation recess 151. Doped isolation region 158 affords, where necessary, additional electrical isolation for adjacent access elements 190.

In the illustrated example of FIGS. 3A and 3B, lower source drain region 130 is implemented by separate doping regions 114 and 124 formed proximate to an offset step region 134. The term "offset step region" in this context means at least one material layer transition from substantially vertical to horizontal to vertical, or from substantially horizontal to vertical to horizontal. More particularly, lower source/drain region 130 in the illustrated example of FIGS. 3A and 3B is implemented as a multi-level LD source/drain region associated with offset step region 134. The term "lightly doped (LD)" in this context describes a material layer region having a concentration of doping impurities provided in two or distributions. These distributions may vary by impurity type, implantation energy, impurity densities, implantation area, etc. For example, the distributions forming a LD source/drain region may be formed by separate doping processes performed under similar or different conditions. However formed, taken collectively the two or more impurity distributions form a LD source/drain structure having beneficial properties well understood in the art.

The term "multi-level" in the foregoing description of lower source/drain region 130 has reference to the fact that the different doping regions (114 and 124) forming lower source/drain region 130 are substantially formed at different vertical levels above the principal surface of substrate 100. For example, first source/drain region 114 may be formed by a first doping (or implantation) of impurities into an upper portion of offset step region 134, while second source/drain region 124 may be formed by a second doping of impurities into a lower portion of offset step region 134. Collectively, the first and second source/drain regions 114,124 form a single lower source/drain region 130 associated with offset step region 134. That is, first and second source/drain regions 114 and 124 are formed in electrical contact with one another, albeit substantially at different vertical levels of offset step region 134.

Unified gate electrode/word line structure 180 illustrated in the embodiment shown in FIGS. 3A and 3B also has a unique geometry. For example, conventional access elements having a vertically oriented channel are connected by word lines having a uniform thickness (i.e., a physical dimension measured in the Z direction) extending across an upper surface of a substrate or on an intervening material layer formed on the substrate. (See, U.S. Pat. No. 5,885,864 and published U.S. Patent Application No. 2006/0118846, the collective subject matter of which is hereby incorporated by reference).

In contrast, each unified gate electrode/word line 180 in the illustrated embodiment has a non-uniform thickness, and more particularly, includes a descending lip portion 181 formed on gate dielectric 106 surrounding (or partially surrounding) each corresponding vertical pillar 102. Descending lip portion 181 overlays at least a portion of lower source/drain region 130, being separated by a portion of gate dielectric 106. In the illustrated example, descending lip portion 181 is disposed between gate dielectric 106 and first interlayer insulating layer 155 which has an upper surface extending above the upper surface of lower source/drain region 130 and above a lower lateral portion 116 of gate dielectric 106.

In the illustrated embodiment, this unique descending lip portion 181 of unified gate electrode/word line 180 results from a fabrication approach taken in relationship to the self-aligned lower source/drain region 130. That is, as will be seen hereafter in relation to certain embodiments of the invention, the formation of a self-aligned lower source/drain region 130 relative to vertical pillar 102, followed by the formation of a unified gate electrode/word line 180 surrounding (or partially surrounding) vertical pillar 102 results in the formation of descending lip portion 181 of unified gate electrode/word line 180 overlaying a portion of lower source/drain region 130.

Formation of a semiconductor device incorporating access elements having a vertically oriented channel consistent with an embodiment of the invention may be accomplished using a variety of fabrication processes. Those of ordinary skill in the art understand that the fabrication of any semiconductor device involves the application of a complex sequence of fabrication processes. Many individual fabrication processes may be used as substitutes for one another. For example, a particular material layer portion may be removed during an overall fabrication process using any number of different processes that vary in type, applied conditions, chemical and/or energetic agents, etc. Several method embodiments adapted to the fabrication of an access element and/or semiconductor device consistent with embodiments of the invention will now be described. Throughout the fabrication method examples that follow, certain presently preferred processes will identified as part of the overall fabrication method to fully convey the making and use of the present invention in the context of the illustrated embodiments. However, other fabrication process substitutes are clearly contemplated and the scope of the invention is not limited to any specific type of fabrication process. Rather, terms like "forming", "removing", "etching", "depositing", etc. are used to denote a range of possible processes capable of accomplishing the stated purpose(s).

Method embodiments of the present invention will now be described with reference to a related sequence of views shown in FIGS. 4A through 4R. For clarity of explanation, a particular semiconductor device type (e.g., a DRAM) has been assumed as a working example. However, those of ordinary skill will recognize that method embodiments of the present invention may be applied to the fabrication of many different types of semiconductor device potentially benefiting from the incorporation of access elements including a vertically oriented channel.

Figure 4A:
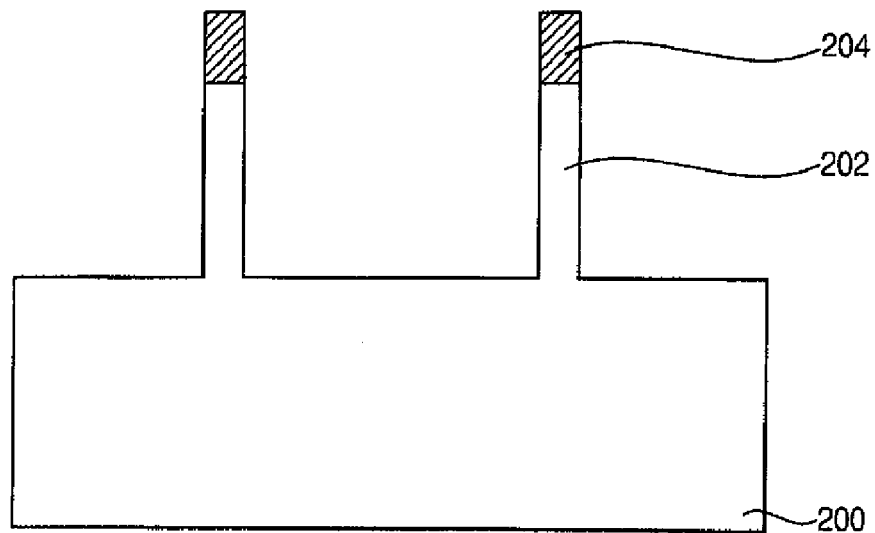
FIGS. 4A through 4R are sequentially related views illustrating an exemplary method of fabricating an access device having a vertically oriented channel according to an embodiment of the invention.

Turning to FIG. 4A, a semiconductor substrate 200 of desired first conductivity type (i.e., a P-type or N-type conductivity) is selectively etched to form a plurality of vertically oriented pillars 202. In one embodiment of the invention, selective etching may be accomplished by use of a pillar mask pattern 204 formed on an original upper surface of substrate 200. Pillar mask pattern 204 may be formed from a nitride material (e.g., SiN) or a dielectric material using conventional patterning techniques.

In one more specific embodiment, vertical pillars 202 may be formed with a vertical height (or thickness) of about 150 nm to 250 nm above the etched upper surface of substrate 200 and a width of about 40 nm. Vertical pillars 202 may be formed with a rectangular, circular, elliptical, etc., cross-section as defined (e.g.,) by the shape of pillar mask pattern 204. However, in one embodiment, an elliptical cross-section (including a circular cross-section) is preferred since such a shape will not develop e-field concentrations at its corners the way rectangular cross-sections do. Such corner e-field concentrations can have adverse influence on certain types of fabrication processes.

As generally noted above, the particular fabrication process applied to the etching of substrate 200 in order to form vertical pillars 202 will vary with the type of material(s) forming substrate 200 and the desired geometry of pillar mask pattern 204, as well as the desired height, width, and cross-sectional shape of vertical pillars 202. In certain embodiments, conventional reactive ion etching (RIE) and/or anisotropic etching techniques may be used to form vertical pillars 202 from substrate 200.

Figure 4B:
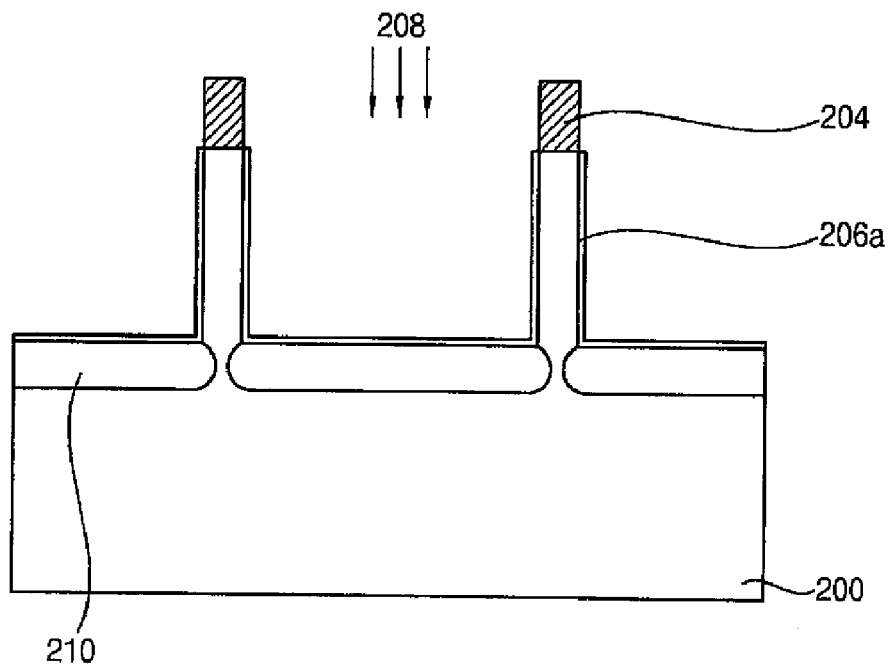
Figure 4C:
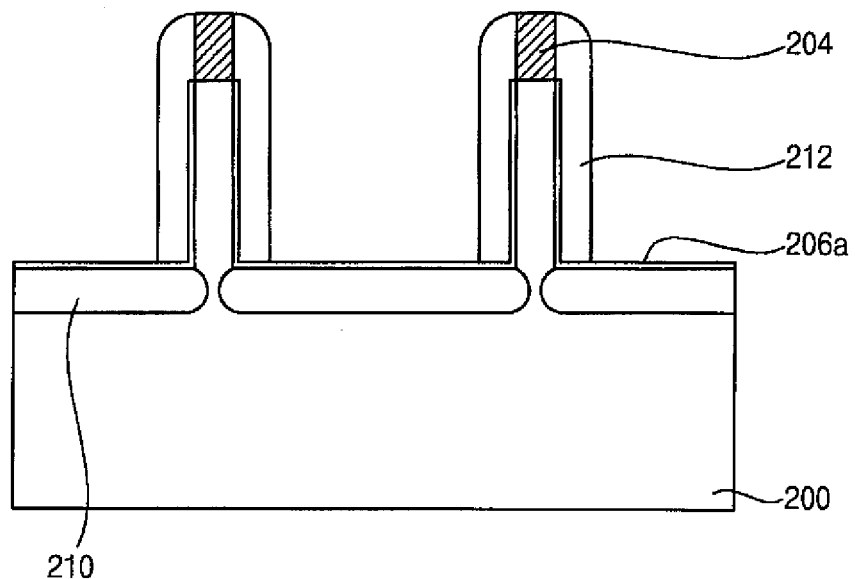

As illustrated in FIGS. 4B and 4C, following the formation of vertical pillars 202, a gate dielectric layer 206A is formed on substrate 200, as masked by pillar mask pattern 204, to cover sidewall surfaces of vertical pillars 202 and exposed upper surface portions of substrate 200. A first doping (e.g., ion implantation) process 208 is performed to form a first source/drain layer 210. A sacrificial gate spacer 212 is also formed on sidewalls of vertical pillars 202.

Sacrificial gate spacer 212 may be conventionally formed by first conformally depositing a sacrificial layer (e.g., a polysilicon layer, a silicon nitride layer, a silicon germanium, etc.) on substrate 200. In one embodiment, the sacrificial layer is deposited to a thickness of about 200A. Then, a selective etch back process, such as a RIE process, is performed to remove lateral portions of the sacrificial layer, leaving sacrificial gate spacer 212 having a defined lateral width on sidewalls of vertical pillars 202.

The fabrication sequence associated with the formation of gate dielectric layer 206A, and/or sacrificial gate spacer 212, as well as performing first doping process 208 is a matter of design choice. In one embodiment, first doping process 208 is performed before or after the deposition of gate dielectric layer 206A, but before the formation of sacrificial gate spacer 212. In certain embodiments, first doping process 208 may be conventionally performed at an energy of 10 KeV or less using one or more impurities of second conductivity type to define first source/drain layer 210. That is, one or more impurities (e.g. boron, phosphorus or arsenic, etc.) having a conductivity type opposite that of substrate 200 may be selected and selectively doped into substrate 200 to form a defined layer of opposite conductivity type.

Alternately, first source/drain layer 210 may be formed by first forming sacrificial gate spacer 212, performing first doping process 208, and thereafter performing a thermal diffusion process. Proper application of a thermal diffusion process, as is well understood by those of ordinary skill in the art, may be used to define a desired impurity distribution and concentration for first source/drain layer 210 in an upper surface region of substrate 200 and more particularly in an upper surface region of substrate 200 disposed under sacrificial gate spacer 212.

In one embodiment, first source/drain layer 210 is formed to a depth of about 200 Å in the upper surface of substrate 200. In other embodiments of the invention first source/drain layer 210 is formed to a depth not greater than 1000 Å in the upper surface of substrate 100. Of note, first doping process 208 may consist of multiple ion implantations and/or multiple thermal diffusions to achieve a desired impurity distribution, concentration, and implantation depth.

Gate dielectric layer 206A may be formed from conventional materials such as silicon oxide, or high-K dielectric materials such as hafnium oxide or tantalum oxide. In one embodiment, gate dielectric layer 206A is formed to a thickness of about 40 Å or less. Gate dielectric layer 206A may be formed either before or after the first doping process 208.

Figure 4D:
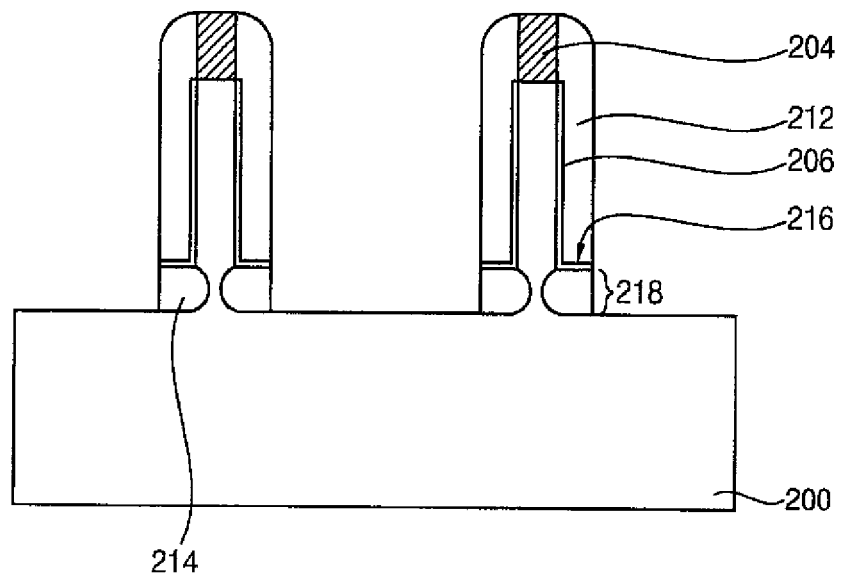

As illustrated in FIG. 4D, after the formation of gate dielectric layer 206A, first source/drain layer 210, and sacrificial gate spacer 212, portions of substrate 200 exposed outside the combination of pillar mask pattern 204 and sacrificial gate spacer 212, together with corresponding portions of gate dielectric layer 206A are removed using, for example, a RIE process to form a first offset recess 218. In the illustrated embodiment, the vertical depth of first offset recess 218 is somewhat less than the implantation depth of first source/drain layer 210. The majority of first source/drain layer 210 and the majority of gate dielectric layer 206A exposed outside of sacrificial gate spacer 212 are removed to form a gate dielectric 206 and a first source/drain region 214. In the illustrated example, gate dielectric 206 includes a lower lateral extension 216 separating a lower surface of sacrificial gate spacer 212 and a first source/drain region 214 which is formed under sacrificial gate spacer 212.

In the illustrated example, the lateral width of first source/drain region 214 is defined in relation to the width of sacrificial gate spacer 212 formed on vertical pillars 202. In this and alternate fabrication processes that may be used to similar effect, first source/drain region 214 is formed in a self-aligned manner with respect to a corresponding vertical pillar 202.

That is, a separate photoresist patterning process is not needed to form first source/drain region 214 in the foregoing embodiments. Yet, each first source/drain region 214 is precisely defined in impurity concentration and physical size and alignment in relation to a corresponding vertical pillar 202. First source/drain region 214 may ultimately serve as all or part of a lower source/drain region formed at one end of a vertically oriented channel implemented by vertical pillar 202. A self-aligned lower source/drain region may be associated with a buried bitline structure in certain memory device embodiments of the invention. Further, this self-aligned lower source/drain region may be formed using a single, well-controlled doping process.

Figure 4E:
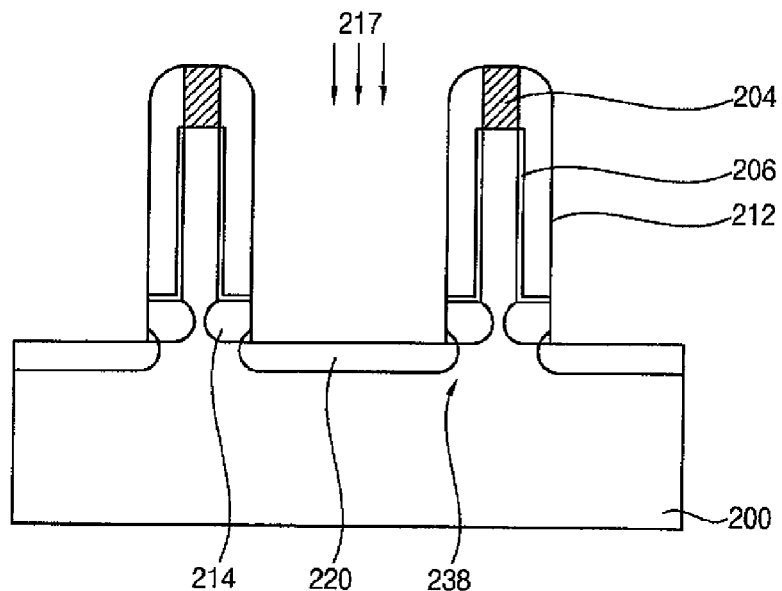
Figure 4F:
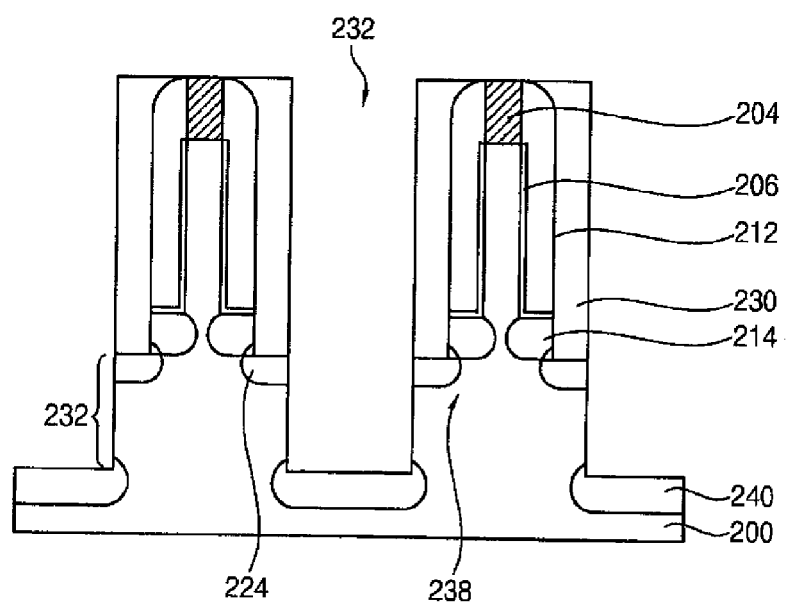

As illustrated in FIGS. 4E and 4F, a second doping process 217 is next performed using the combination of pillar mask pattern 204 and sacrificial gate spacer 212 as a doping mask. Second doing process 217 may be used to implant additional impurities of second conductivity type into substrate 200, and more particularly into first offset recess 218 in substrate 200 to form a second source/drain layer 220. In certain embodiments, the doping depth of second source/drain layer 220 will vary from about 200 to 500 Å. However, second source/drain layer 220, where present, will be formed in electrical contact with first source/drain region 214. The term "electrical contact" in this context means that the impurities of second conductivity type contained in first source/drain region 214 and the impurities of second conductivity type contained in second source/drain region 224 subsequently formed from second source/drain region 220 act in combination as a pool of potential electrical carriers during operation of the constituent access device. Thus, in one embodiment of the invention, first and second source/drain regions 214 and 224 effectively form a lower source/drain region 238.

One example of the formation of second source/drain region 224 from second source/drain layer 220 is illustrated in FIG. 4F. In FIG. 4F, a hardmask pattern 230 is formed on sidewall surfaces of sacrificial gate spacer 212. Hardmask pattern 230 may be conventionally formed by depositing a hardmask layer over the working surface of substrate 100, and then planarizing the upper surface of the hardmask layer using pillar mask pattern 204 and/or sacrificial gate spacer 212 as a polishing stop. After planarization, a photoresist (PR) pattern may be formed on the hardmask layer and a RIE process applied through the PR pattern. The PR pattern may then be removed.

The resulting hardmask pattern 230, as formed on sidewalls of sacrificial gate spacer 212, may be used to define the lateral width of second source/drain region 224. Using hardmask pattern 230 as a mask, exposed portions of substrate 200 may be removed using, for example, a conventional RIE process to form an isolation recess 232. Isolation recess 232, together with a first interlayer insulating layer, separates and electrically isolates adjacent access elements in the illustrated example. The process forming isolation recess 232 also removes portions of second source/drain layer 220 exposed outside of hardmask pattern 230 and thereby forms second source/drain region 224 under hardmask pattern 230. In one embodiment, isolation recess 232 is formed to a depth of about 2500 Å.

Once isolation recess 232 is formed, another doping process may be conducted to selectively form an isolation region 240 in substrate 200. Isolation region 240 is an optional feature providing additional electrical isolation between adjacent access elements (e.g., adjacent individual memory cells in the context of a memory device embodiment of the invention). It may be formed by implanting impurities of first conductivity type in isolation recess 232. In the context of a memory device embodiment of the invention, isolation region 240 may be formed at the bottom of isolation recess 232 below BBL structures associated with adjacent access elements. The necessity or advisability of isolation region 240 will be determined by the material composition of substrate 200, the separation distance between adjacent access elements, the conductivity concentrations of the various elements and regions, etc. For example, in certain embodiments where substrate 200 is a silicon on insulator (SOI) substrate, isolation region 240 may not be necessary.

Once isolation recess 232 is formed, hardmask pattern 230 may be removed from sacrificial gate spacer 212 using a selective etching process. Etching selectivity in this regard will be a function of the different materials used to form hardmask pattern 230 and sacrificial gate spacer 212.

Figure 4G:
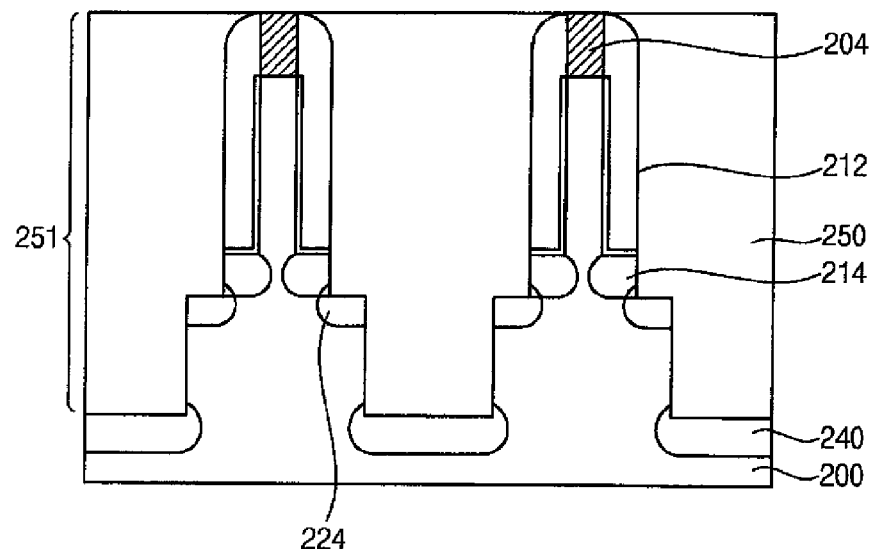

As illustrated in FIG. 4G, following removal of hardmask pattern 230, and formation of second source/drain region 224 and isolation recess 232, a first interlayer insulation material 250 may be conformally deposited over the working surface of substrate 200. First interlayer insulation material 250 may be a flowable oxide, a high density plasma oxide, BPSG, USG, etc. Once formed on substrate 200, first interlayer insulation material 250 is planarized to a uniform first thickness 251 using, for example, pillar mask pattern 204 as a polishing stop.

Figure 4H:
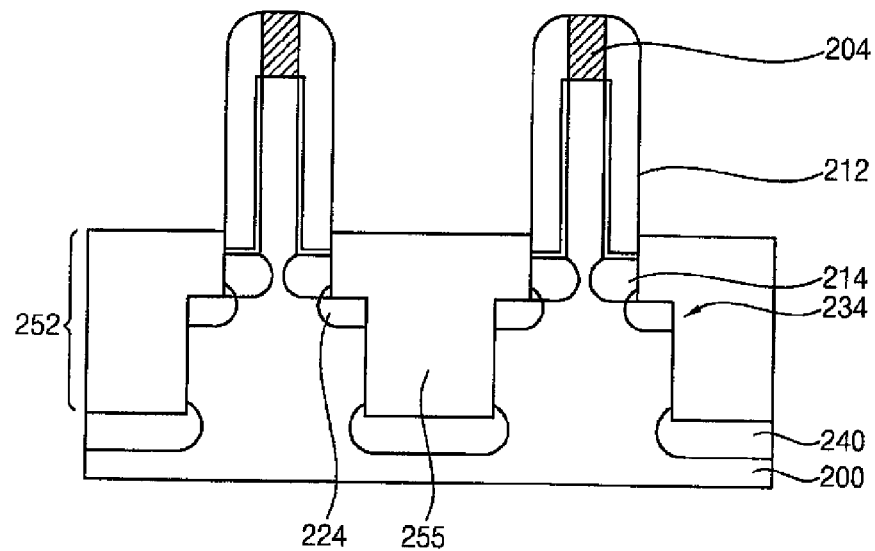

With reference to FIG. 4H, the uniform first thickness of first interlayer insulation material 250 is then etched backed to a desired second thickness 252 less than the first thickness in order to form a first interlayer insulation layer 255. Etching of first interlayer insulation material 250 may be accomplished using a timed conventional wet etch process and/or a dry etch process, such as a HF wet etch or LAL. Of note, the etching process(es) applied to first interlayer insulation material 250 should be selective with respect to the materials forming pillar mask pattern 204 and sacrificial gate spacer 112.

At this point in the fabrication of the exemplary semiconductor device according to a method consistent with an embodiment of the invention, a BBL structure for each memory cell is apparent. With reference to FIGS. 3A, 3B, and 4H, transverse columns of buried bit lines can be seen extending in the Y direction over substrate (100) 200. Indeed, as may be seen in FIG. 4H, for example, the BBL structure includes an offset step region 234. Offset step region 234 includes lower source/drain region 238 formed at multiple vertical levels of the offset step region 234. Namely, first lower source/drain region 214 is formed in an upper level position of offset step region 234 and second lower source/drain region 224 is formed in an lower level position of offset step region 234. (However, as previously noted the two source/drain regions are formed in electrical contact).

Figure 4I:
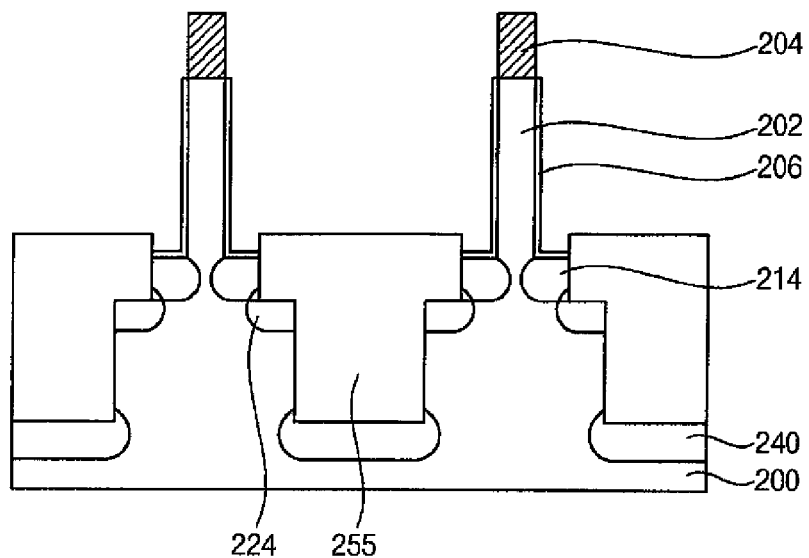
Figure 4J:
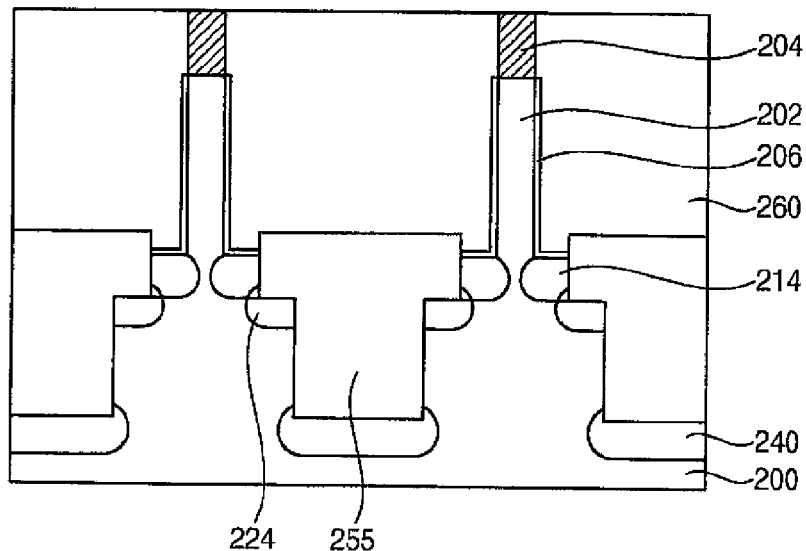
Figure 4K:
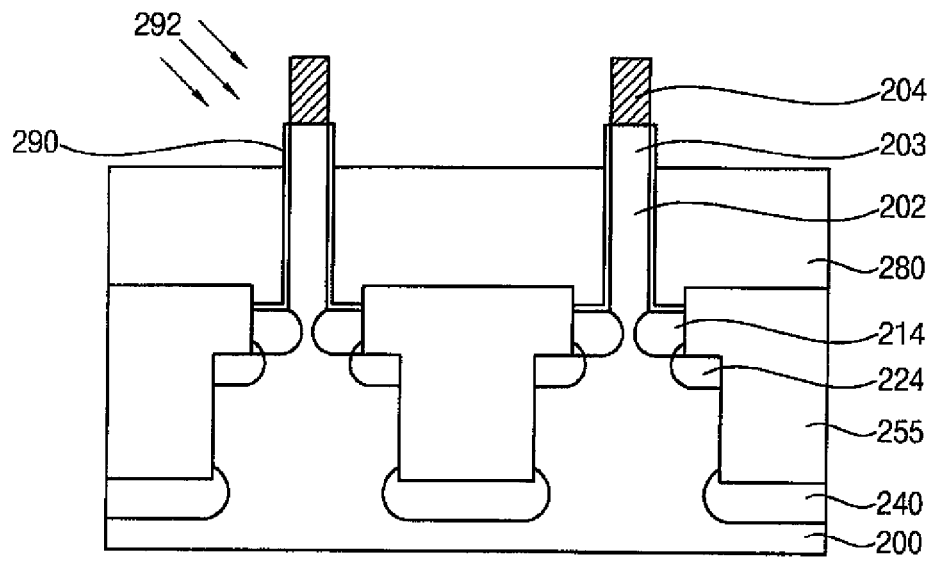
Figure 4L:
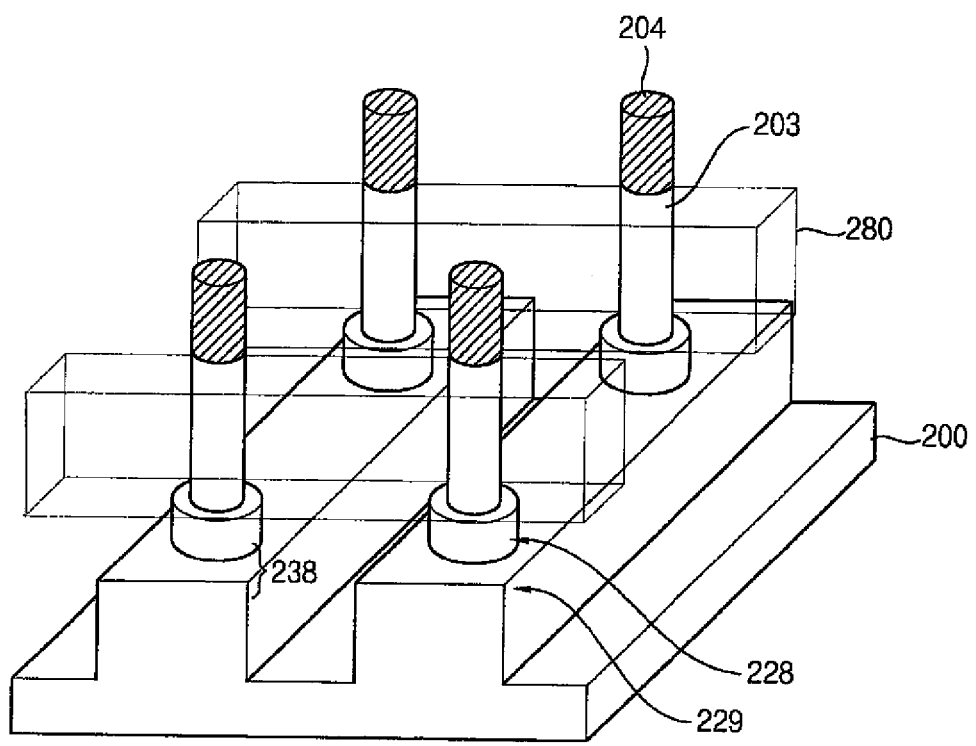

Indeed, the specific access device illustrated in FIGS. 3A, 4K, and 4L comprises a lower source/drain region 238 including a first source/drain region 214 disposed in a peripheral region 228 of the BBL structure at least partially surrounding a portion of vertical pillar 202 and a second source/drain region 224 disposed in a lateral region extending the length of the BBL structure 229.

In at least the context of a memory device embodiment of the invention, first interlayer insulation layer 255 may be formed with a thickness sufficient to completely cover the lower source/drain region 238. In the illustrated example this disposition of first interlayer insulation layer 255 results in the upper surface of first interlayer insulation layer 255 extending vertically "above" (or higher than) the lower lateral extension 216 of gate dielectric 206 and extending beyond the uppermost level of first lower source/drain region 214.

This fully insulating disposition of first interlayer insulation layer 255 relative to lower source/drain region 238 may be particularly important to memory device embodiments of the invention since any un-insulated overlap of drain and gate components may result in a well understood phenomenon known as Gate-Induced-Drain-Leakage or GIDL. While GIDL does not pose a significant problem for logic devices and other types of semiconductor devices, it can negatively effect the operating speed performance of memory device fabricated according to an embodiment of the invention. Accordingly, in the illustrated embodiment shown in FIGS. 4A through 4R, first interlayer insulation layer 255 extends above the lower source/drain region 238.

As shown in FIG. 4I, following formation of first interlayer insulation layer 255, sacrificial gate spacer 212 is removed from vertical pillar 202, exposing gate dielectric 206. Selective removal of sacrificial gate spacer 212 may be accomplished in one embodiment by application of an isotropic wet etch. For example, if sacrificial gate spacer 212 is formed from a nitride material, an wet etch process using $H_3PO_4$ may be used. However, if sacrificial gate spacer 212 is formed from polysilicon or silicon oxide, for example, a conventional poly-etchant may be used.

As shown in FIG. 4J, following removal of sacrificial gate spacer 212 a conductive material 260 is conformally deposited over the working surface of substrate 200 and then planarized to a first thickness using a conventional CMP process and pillar mask pattern 204 as a polishing stop. Conductive material 260 may include a polysilicon or doped polysilicon material, a metal (e.g., tungsten), a metal nitride or metal silicide (e.g., tantalum nitride) or a combination of same. In one embodiment, multiple conductive materials may be deposited in a laminate to form conductive material 260.

As shown in FIG. 4K, following planarization of conductive material 260, the resulting first uniform thickness is etched-back to a second thickness using conventional processes. With a desired second thickness conductive material 260 may serve as a unified gate electrode/word line 280. The ultimate second thickness of unified gate electrode/word line 280 is a matter of design choice and will vary with the material composition of conductive material 260. However, in one embodiment a RIE process or selective wet etch process is used to etch conductive material 260.

At a minimum some upper end portion 203 of vertical pillar 202 is exposed beyond the upper surface of unified gate electrode/word line 280 by the applied etching process. The geometry of upper end portion 203 is a matter of design choice, but must be sufficiently large to allow the fabrication of a competent upper source/drain region 290 in an upper end portion 203 of vertical pillar 202. In one embodiment of the invention, upper end portion 203 exposed above the upper surface of unified gate electrode/word line 280 is about 100 nm in thickness, and the residual (second) thickness of unified gate electrode/word line structure 280 is about 150 nm.

This stage of the exemplary fabrication process consistent with an embodiment of the invention is further illustrated in perspective view of FIG. 4L.

The formation of upper source drain region 290 may be variously accomplished. For example, pillar mask pattern 204 may be removed and selected impurities vertically doped into an exposed upper surface of vertical pillar 202. However, subsequent formation of a second interlayer insulating layer 310 may benefit from the continued presence of pillar mask pattern 204. In such cases, upper source/drain region 290 may be formed in upper end portion 203 of vertical pillar 202 using a large angle ion implantation process, a plasma added ion implantation process, or some other conformal doping process 292. Such fabrication processes may involve the application of a thermal diffusion step, but each allows the formation of upper source/drain region 290 without removing pillar mask pattern 204. In certain embodiments of the invention, upper source/drain region 290 may have a LD structure.

Figure 4M:
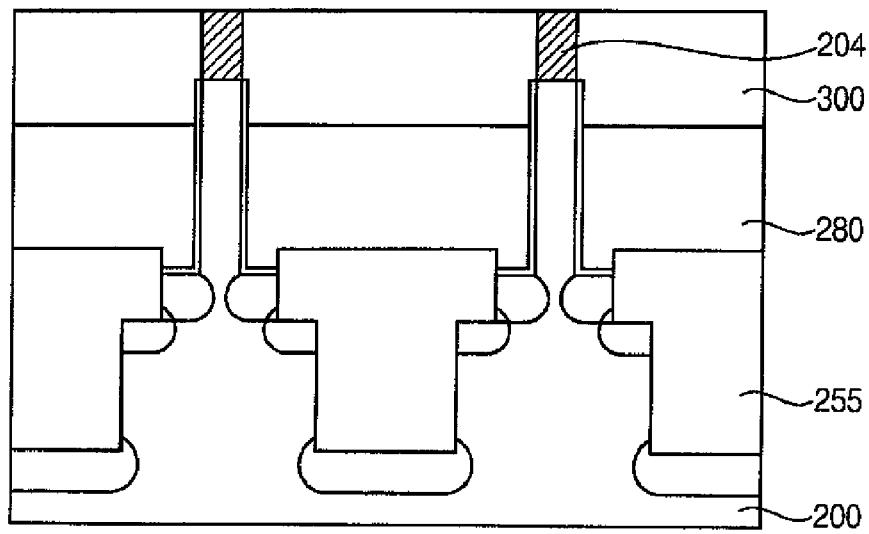

As shown in FIG. 4M, following formation of upper source/drain region 290, a second interlayer insulating material 300 is formed over the working surface of substrate 200 and planarized to a uniform first thickness using pillar mask pattern 204 as a polishing stop. Second interlayer insulation material 300 may be a flowable oxide, a high density plasma oxide, BPSG, USG, etc.

Figure 4N:
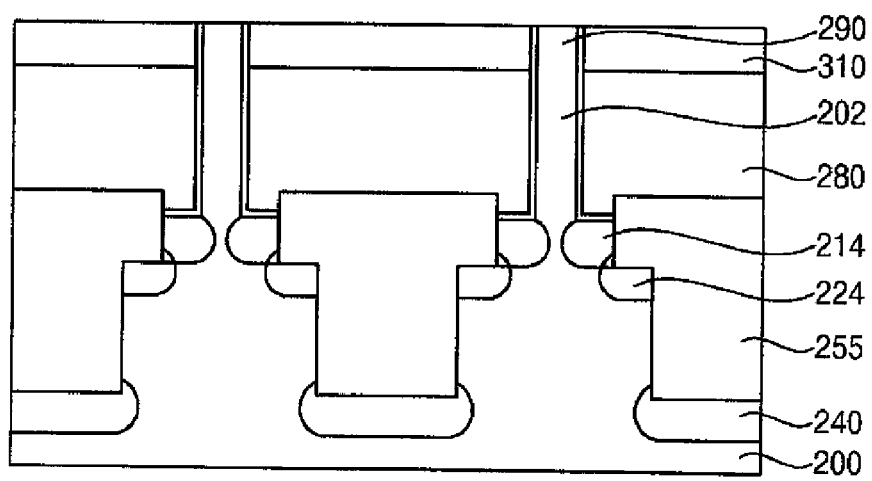

As shown in FIG. 4N, after planarization of second interlayer insulation material 300, the first thickness of second interlayer insulation material 300 may be reduced to a desired second thickness using a conventional CMP process and the upper silicon surface of vertical pillar 202 as a polishing stop. Thus, a competent CMP process may be used to remove both pillar mask pattern 204 and an upper portion of second interlayer insulation material 300 to form second interlayer insulating layer 310. Alternately, the hardmask material forming pillar mask pattern 204 may be selectively removed before reduction in the thickness of second interlayer insulation material 300.

Figure 4O:
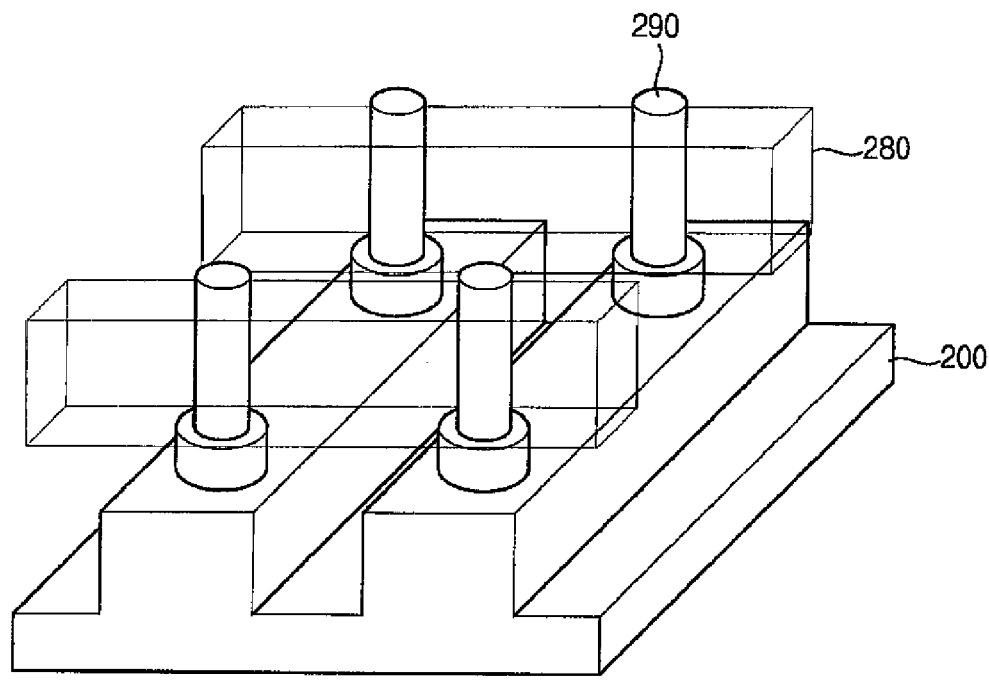

This stage of the exemplary fabrication process consistent with an embodiment of the invention is further illustrated in perspective view of FIG. 4O. Of note, upper source/drain region 290 is now exposed for additional processing directed to the electrical connection of a subsequently formed element, such as storage element in the context of a memory device embodiment of the invention. Alternately, a conductive metal line or similar structure may be connected to upper source drain region 290 in the context of an incorporating device other than a semiconductor memory.

Figure 4P:
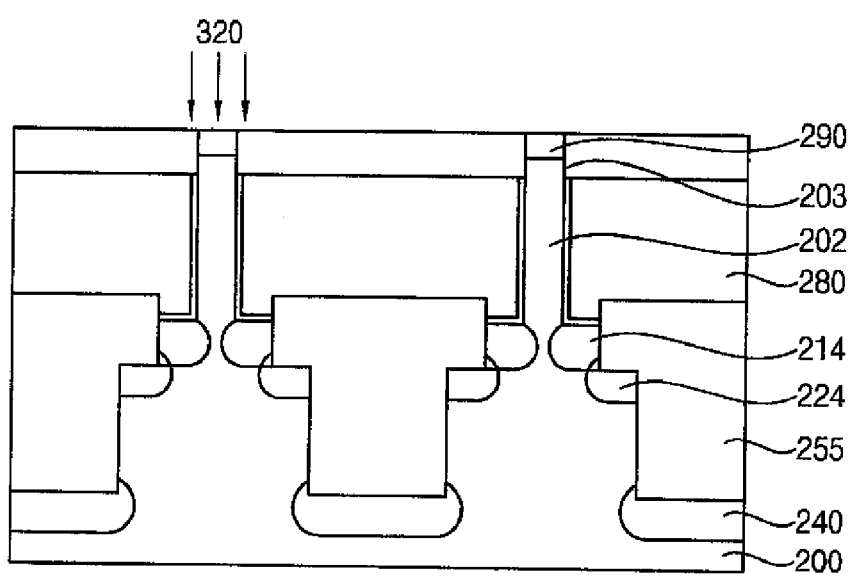

For example, as shown in FIG. 4P a conditioning implant or other rehabilitating fabrication process 320 may be performed to prepare upper source/drain region 290 for connection to a storage element, such as a capacitor. Such conditioning may be required to repair damage caused by the removal of pillar mask pattern 204 and/or the thinning of second interlayer insulation material 300. Alternately, instead of forming upper source/drain region 290 prior to the formation of second interlayer insulating material 300, the upper surface of second interlayer insulating layer 310 may be masked and impurities selectively implanted into upper end portion 203 of vertical pillar 202.

Figure 4Q:
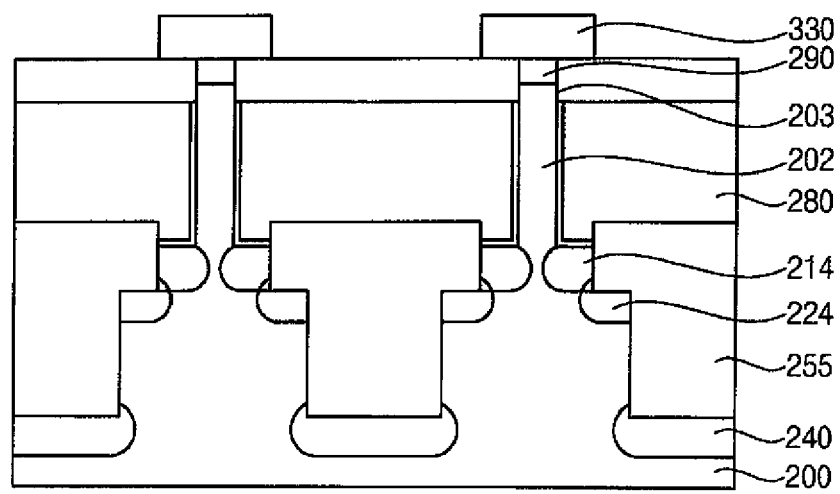

As shown in FIG. 4Q, in certain embodiments requiring very low contact resistance between upper source/drain region 290 and a connecting upper element (e.g., a storage element in a memory cell), a contact node 330 may be formed on upper source/drain region 290 using a selective epitaxial lateral overgrowth process (SEG Si). This type of process is conventionally understood and in its contemporary application is relatively expensive. However, upper contact node 330 provided by this type of process is remarkably low in its contact resistance.

Figure 4R:
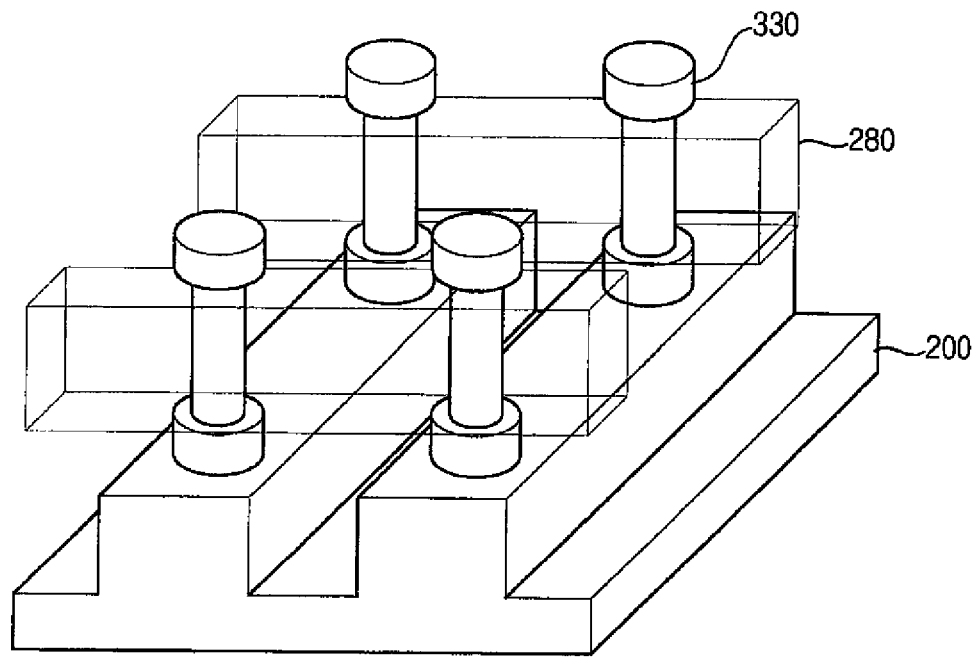

This stage of the exemplary fabrication process including formation of an upper contact node 330 consistent with an embodiment of the invention is further illustrated in perspective view of FIG. 4R.

Various embodiments of the invention have been illustrated with lightly doped (LD) source/drain regions. Indeed, like lower source/drain region 130 (FIGS. 3A and 3B) upper source/drain region 140 may benefit from a LD structure. The benefits afforded by LD source/drain structures are well documented. However, embodiments of the invention are not limited to only those including LD source/drain regions. For example, access elements associated with a control logic device rarely if ever require a LD source/drain structure.

At least in the exemplary context of a semiconductor memory device, the capabilities of embodiments of the invention to avoid or greatly reduce GIDL over that found in conventional laterally disposed access elements is very noteworthy. Process variations in the thickness formation of a gate oxide layer and/or impurity concentrations in related source/drain regions in conventional laterally oriented access elements often leads to notable GIDL. The unique arrangement of analogous elements in an access element having a vertically oriented channel and fabricated according to an embodiment of the invention avoids these problems.

The foregoing method embodiments illustrate a "sacrificial replacement gate" approach to the formation of the unified gate electrode/connection line. That is, the formation and subsequent removal and replacement of a sacrificial gate spacer having a defined lateral width with a descending lip portion of a unified gate electrode/connection line allows accurate self-aligned formation of a lower source/drain region without requiring separate formation of a gate electrode and a connecting line.

The term "implant" or "implantation" as used above is not limited to only fabrication processes strictly implanting impurities with directed energy fields. Rather, an "implantation process" or step of implanting may be read more generally as any process capable of "doping" a target material with selected impurities.

Geometrically or spatially descriptive terms used throughout this description, such as upper/lower, above/below, under/ over, lateral/vertical are used in relative contexts in relation to the illustrated embodiments. An overly literal or wooden interpretation should not be ascribed to these terms. Like X, Y, and Z directions and relative planes of orientation, such terms merely distinguish relative orientations in the context of illustrated embodiments.

Several DRAM examples have been used as a vehicle to describe exemplary embodiments of the invention. However, other types of semiconductor memory devices may benefit from incorporation of access elements (e.g., transistors) having a vertical oriented channel and fabricated according to an embodiment of the invention. Other type of memories capable of including such access devices include, static random access (SRAM), phase random access (PRAM), flash including NOR and NAND, other nonvolatile forms of memory. As previously noted, certain logic circuits may also benefit from incorporation of access elements (e.g., transistors) having a vertical oriented channel and fabricated according to an embodiment of the invention.

Figure 5A:
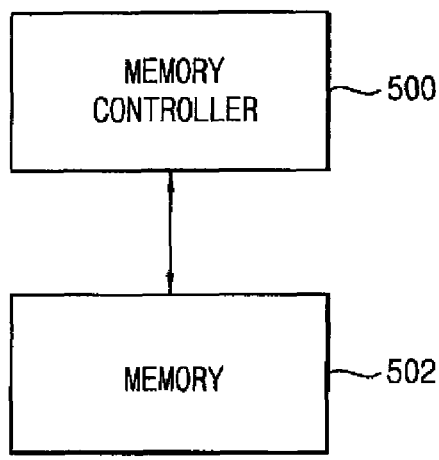
FIGS. 5A and 5B are related views illustrating a memory system incorporating a memory designed and fabricated according to an embodiment of the invention.
Figure 5B:
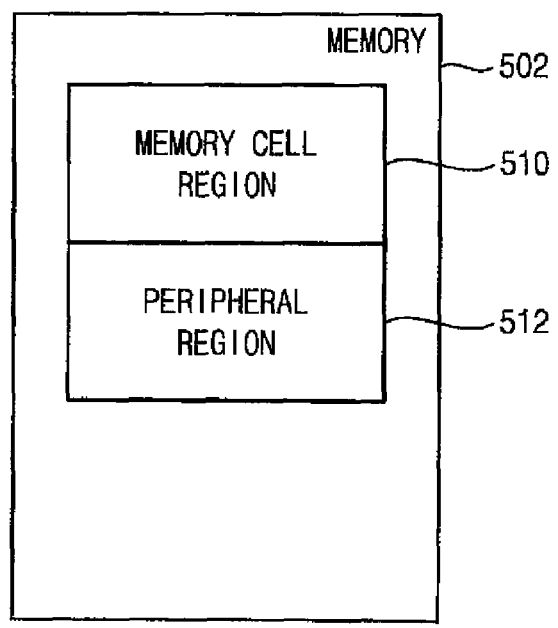

For example, FIG. 5A generally illustrates a memory system including a conventional memory controller 500 and a memory 502 of any type and incorporating an access element having a vertically oriented channel and fabricated according to an embodiment of the invention. As further illustrated in FIG. 5B, memory 502 may include a memory cell region 510 and one or more peripheral regions 512. In one embodiment, the dense array of memory cells forming memory cell region 510 are particularly well suited to the incorporation of access elements having a vertical oriented channel and fabricated according to an embodiment of the invention. However, certain access elements in peripheral region 512 may also benefit from design and fabrication according to an embodiment of the invention.

Indeed, peripheral region 512 may well comprises a mixture of conventional access elements having laterally oriented channel regions and other access elements having a vertical oriented channel and fabricated according to an embodiment of the invention. This combination of elements may be used, for example, to implement one or more decoder circuits within peripheral region 512. Such decoder circuits are conventionally understood and generally provide word line voltages as control signals to the respective word lines extending across a memory array in memory cell region 510. In certain embodiments of the invention the access elements provided in peripheral region 512 may be much large than those provided in memory cell region 510, and may also be more widely separated from adjacent access elements, therefore reducing electrical isolation requirements such as those provided by isolation region 158 in the embodiment illustrated in FIG. 3B.

It should be noted that while the invention has been taught in the context of selected embodiments and detailed examples teaching the making and use of the invention, the invention is not limited to only the disclosed embodiments. Those of ordinary skill in the art will recognize that various modifications and alterations may be made to these embodiments without departing from the scope of the invention as defined by the following claims.

What is claimed:

1. An access device adapted for use in a semiconductor device and comprising:
   a vertically oriented channel separating a lower source/drain region and an upper source/drain region;
   a gate dielectric disposed on the channel;
   a unified gate electrode/connection line coupled to the channel across the gate dielectric, wherein the unified gate electrode/connection line is formed on a first interlayer insulating layer and over the lower source/drain region, and comprises;
      a descending lip portion having a vertical edge disposed directly on the gate dielectric, and a lower lateral edge extending from the vertical edge away from the channel to overlay at least a portion of the lower source/drain region, and
      a lateral portion extending laterally from the descending lip portion away from the channel and having a flat lateral lower surface disposed on the interlayer insulating layer,
   wherein an upper surface of the lower source/drain region is lower than an upper surface of the first interlayer insulating layer.

2. The access device of claim 1, wherein the gate dielectric comprises a lower lateral portion extending away from the channel and separating the descending lip portion of the unified gate electrode/connection line from the lower source/drain region.

3. The access device of claim 1, wherein the unified gate electrode/connection line is a unified gate electrode/word line and the lower source/drain region is associated with a buried bit line (BBL) structure.

4. The access device of claim 3, wherein the BBL structure comprises an offset step region.

5. The access device of claim 4, wherein the lower source/drain region is a multi-level source/drain region comprising a first source/drain region disposed in an upper portion of the offset step region and a second source/drain region disposed in a lower portion of the offset step region.

6. The access device of claim 3, wherein the lower source/drain region comprises a first source/drain region disposed in a peripheral region at least partially surrounding a portion of the channel and a second source/drain region disposed in a lateral region extending the length of the BBL structure.

7. The access device of claim 6, further comprising a contact pad electrically connected to the upper source/drain region.

8. The access device of claim 7, wherein the channel comprises a vertical pillar of silicon material and the contact pad is a silicon contact pad epitaxially grown from the silicon material.

9. The access device of claim 1, wherein the unified gate electrode/connection line is a unified gate electrode/word line and the lower source/drain region is associated with a buried bit line (BBL) structure; and
   wherein the unified gate electrode/word line, the channel, the lower source/drain region and the upper source region operate in combination as a field effect transistor (FET) within a memory cell.

10. The access device of claim 1 wherein the unified gate electrode/connection line completely surrounds at least a portion of the channel.

11. A semiconductor device, comprising:
   adjacent first and second access devices disposed on a substrate, the first access device comprising a vertically oriented first channel separating a first lower source/drain region and a first upper source/drain region and a first gate dielectric disposed on the first channel, and the second access device comprising a vertically oriented second channel separating a second lower source/drain region and a second upper source/drain region and a second gate dielectric disposed on the second channel;
   a first interlayer insulating layer disposed on the substrate and separating the first and second access devices; and a unified gate electrode/connection line disposed on the first interlayer insulating layer and respectively coupled to the first and second channels of the first and second access devices, wherein the unified gate electrode/connection line comprises opposing first and second descending lip portions separated by an intervening lateral portion, wherein the first descending lip portion comprises a first vertical edge disposed directly on the first gate dielectric, and a first lower lateral edge extending laterally from the first vertical edge away from the first channel to overlay at least a portion of the first lower source/drain region, the second descending lip portion comprises a second vertical edge disposed directly on the first gate dielectric, and a second lower lateral edge extending laterally from the second vertical edge away from the second channel to overlay at least a portion of the second lower source/drain region, the lateral portion extends over a flat upper surface of the first interlayer insulating layer, and the first and second lower lateral edges are lower than the flat upper surface of the first interlayer insulating layer.

12. The semiconductor device of claim 11, wherein the first gate dielectric comprises a first lower lateral portion extending away from the first access device and separating the first descending lip portion from the first lower source/drain region, and the second gate dielectric comprises a second lower lateral portion extending away from the second access device and separating the second descending lip portion from the second lower source/drain region.

13. The semiconductor device of claim 11, wherein the semiconductor device is a semiconductor memory device, the unified gate electrode/connection line is a unified gate electrode/word line, and the first and second source/drain regions are disposed in a respective buried bit line (BBL) structure.

14. The semiconductor access device of claim 11, wherein the first and second source/drain regions are each respective multi-level source/drain regions comprising one source/drain region formed in an upper portion of an offset step region and another source/drain region formed in a lower portion of an offset step region.

15. The semiconductor device of claim 11, wherein each of the first and second source/drain regions comprises one source/drain region formed in a peripheral region at least partially surrounding a portion of a corresponding one of the first and second channels and another source/drain region formed as a lateral region extending the length of a corresponding BBL structure.

16. The semiconductor device of claim 11, wherein the unified gate electrode/connection line is a unified gate electrode/word line and the first and second lower source/drain regions are respectively associated with a buried bit line (BBL) structure, and each one of the first and second access devices operates as a field effect transistor (FET) in a respective memory cell.

17. The semiconductor device of claim 16, wherein the semiconductor device is one selected from a group consisting of a dynamic random access memory (DRAM), a static random access memory (SRAM), a phase random access memory (PRAM), a NOR flash memory, and a NAND flash memory.

* * * * *